(12) United States Patent
Kaneko et al.

(10) Patent No.: US 7,037,625 B2
(45) Date of Patent: May 2, 2006

(54) PHASE SHIFT MASK BLANK AND METHOD OF MANUFACTURE

(75) Inventors: Hideo Kaneko, Niigata-ken (JP); Yukio Inazuki, Niigata-ken (JP); Tetsushi Tsukamoto, Niigata-ken (JP); Satoshi Okazaki, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 133 days.

(21) Appl. No.: 10/179,969

(22) Filed: Jun. 26, 2002

(65) Prior Publication Data

US 2003/0008219 A1    Jan. 9, 2003

(30) Foreign Application Priority Data

Jun. 26, 2001    (JP) .............................. 2001-192958

(51) Int. Cl.
    *G03F 1/00*    (2006.01)
(52) U.S. Cl. ........................................................ 430/5
(58) Field of Classification Search ..................... 430/5
    See application file for complete search history.

(56) References Cited

U.S. PATENT DOCUMENTS

| 5,514,499 | A | 5/1996 | Iwamatsu et al. |
| 5,605,776 | A | 2/1997 | Isao et al. |
| 5,811,208 | A * | 9/1998 | Yokoyama et al. ............. 430/5 |
| 5,939,227 | A | 8/1999 | Smith |
| 6,051,345 | A | 4/2000 | Huang |
| 6,641,958 | B1 * | 11/2003 | Inazuki et al. .................. 430/5 |
| 2002/0012855 | A1 * | 1/2002 | Yan et al. ....................... 430/5 |
| 2002/0039690 | A1 * | 4/2002 | Inazuki et al. .................. 430/5 |
| 2002/0119378 | A1 | 8/2002 | Angelopoulos et al. |
| 2004/0191646 | A1 * | 9/2004 | Yoshikawa et al. ............. 430/5 |
| 2004/0197679 | A1 * | 10/2004 | Yoshikawa et al. ............. 430/5 |

FOREIGN PATENT DOCUMENTS

| DE | 100 55 280 A1 | 12/2001 |
| EP | 1 117 000 A2 | 7/2001 |
| EP | 1 176 466 A1 | 1/2002 |
| JP | 7-140635 | 6/1995 |
| JP | 2001201842 A | 7/2001 |

* cited by examiner

*Primary Examiner*—Geraldine Letscher
(74) *Attorney, Agent, or Firm*—Birch, Stewart, Kolasch & Birch, LLP

(57) ABSTRACT

A phase shift mask blank is composed of a transparent substrate and a phase shift film thereon. The phase shift film is made of at least two types of layer stacked in alternation, each type having a different composition and containing at least one element selected from among metals, silicon, oxygen and nitrogen. The alternately layered film enables a high-quality phase shift mask blank having improved chemical resistance to be achieved.

18 Claims, 2 Drawing Sheets

PHASE SHIFT MASK BLANK AND METHOD OF MANUFACTURE

BACKGROUND OF THE INVENTION

1. Field of the Invention

The present invention relates to phase shift mask blanks suitable for use in photolithography associated with the microfabrication of electronic products such as semiconductor integrated circuits, charge-coupled devices, color filters for liquid-crystal displays, and magnetic heads. The invention relates also to a method of manufacturing such phase shift mask blanks.

The invention relates most particularly to halftone phase shift mask blanks which can attenuate the intensity of exposure wavelength light with a phase shift film, and to a method of manufacturing such phase shift mask blanks.

2. Prior Art

The photomasks that are used in a broad range of applications, including the manufacture of semiconductor integrated circuits (IC) and large-scale integration (LSI) chips, are basically composed of a transparent substrate on which a light-shielding film made primarily of chromium has been formed in a given pattern. The market demand for ever higher levels of integration in semiconductor integrated circuits has led to a rapid reduction in the minimum feature size of photomask patterns. Such miniaturization has been achieved in part by the use of shorter wavelength exposure light.

However, while exposure using shorter wavelength light does improve resolution, it also has a number of undesirable effects, such as reducing the focal depth, lowering process stability and adversely impacting product yield.

One pattern transfer technique that has been effective for resolving such problems is phase shifting. This involves the use of a phase shift mask as the mask for transferring microscopic circuit patterns.

As shown in accompanying FIGS. 6A and 6B, phase shift masks (including halftone phase shift masks) are typically composed of a substrate 1 on which a phase shift film 2 has been patterned. The mask has both exposed substrate areas (first light-transmitting areas) 1a on which there is no phase shift film, and phase shifters (second light-transmitting areas) 2a that form a pattern region on the mask. The phase shift mask improves contrast of the transferred image by providing, as shown in FIG. 6B, a phase difference of 180 degrees between light passing through the pattern region and light passing through the non-pattern region, and utilizing the destructive interference of light at the boundary regions of the pattern to set the light intensity in the areas of interference to zero. The use of phase shifting also makes it possible to increase the focal depth at the necessary resolution. Hence, compared with a conventional mask having an ordinary exposure pattern, such as one composed of chromium film, a phase shift mask can improve resolution and increase the margin of the exposure process.

For practical purposes, such phase shift masks can be broadly categorized, according to the light-transmitting characteristics of the phase shifter, as either completely transmitting phase shift masks or halftone phase shift masks. Completely transmitting phase shift masks are masks in which the phase shifter has the same light transmittance as the substrate, and which are thus transparent to light at the exposure wavelength. In halftone phase shift masks, the phase shifter has a light transmittance that ranges from about several percent to several tens of percent the transmittance of exposed substrate areas.

Accompanying FIG. 1 shows the basic structure of a halftone phase shift mask blank, and FIG. 2 shows the basic structure of a halftone phase shift mask. The halftone phase shift mask blank shown in FIG. 1 is composed of a substrate 1 which is transparent to the exposure light and on which a halftone phase shift film 2 has been formed. The halftone phase shift mask shown in FIG. 2 is composed of halftone phase shifters 2a which have been obtained by patterning the phase shift film 2 and form the pattern regions of the mask, and exposed substrate areas 1a on which there is no phase shift film. The arrangement of the two types of areas defines the mask pattern.

Exposure light that has passed through a phase shifter 2a is phase-shifted relative to exposure light that has passed through an exposed substrate area 1a (see FIGS. 6A and 6B). The transmittance of the phase shifter 2a is selected such that exposure light which has passed through the phase shifter 2a has too low an intensity to sensitize the resist on the substrate to which the pattern is being transferred. Accordingly, the phase shifter 2a functions to substantially shield out the exposure light.

Halftone phase shift masks of the above type include halftone phase shift masks having a simple, single-layer construction. Single-layer halftone phase shift masks known to the art include those described in JP-A 7-140635 which have a phase shifting film composed of molybdenum silicide oxide (MoSiO) or molybdenum silicide oxide nitride (MoSiON).

Such phase shift masks may be manufactured by using a lithographic process to pattern a phase shift mask blank. The lithographic process typically involves applying a resist onto the phase shift mask blank, sensitizing desired areas of the resist with an electron beam or ultraviolet light, carrying out development to expose the surface of the phase shift film, then etching desired areas of the phase shift film using the patterned resist film as the mask so as to expose the substrate. The resist film is then stripped, giving the finished phase shift mask.

The phase shift mask is provided with a phase shift pattern by a dry etching operation in which the phase shift film is etched using the resist pattern formed on the transparent substrate as the mask. However, the phase shift film has a poor resistance to pre-treatment such as cleaning in the phase shift mask production process, and to cleaning fluids such as sulfuric acid used for such purposes. As a result, the optical constants of the phase shift film sometimes change during phase shift mask production.

SUMMARY OF THE INVENTION

It is therefore an object of the invention to provide phase shift mask blanks having a good chemical resistance. Another object of the invention is to provide a method of manufacturing such phase shift mask blanks.

We have discovered that phase shift mask blanks which are composed of a substrate transparent to the exposure wavelength and a phase shift film that has been formed on the substrate, and wherein the phase shift film is a multilayer film made of at least two types of layer, each having different compositions and containing at least one element selected from among metals, silicon, oxygen and nitrogen, which are stacked in alternation, have an improved chemical resistance.

Accordingly, in a first aspect, the invention provides a phase shift mask blank composed of a transparent substrate and a phase shift film on the substrate, wherein the phase shift film is a multilayer film made of at least two types of layer, each having a different composition and containing at least one element selected from among metals, silicon, oxygen and nitrogen, which are stacked in alternation.

Preferably, the phase shift film is an alternately stacked multilayer film made of molybdenum silicide nitride and molybdenum silicide oxide nitride. Typically, it changes the phase of exposure light passing through it by 180±5 degrees and has a transmittance of 3 to 40%.

In a second aspect, the invention provides a method of manufacturing a phase shift mask blank composed of a transparent substrate and a phase shift film on the substrate. Reactive sputtering is carried out using a metal silicide sputtering target while varying the type or flow rate of reactive gas in a single film-forming chamber so as to form as the phase shift film an alternately stacked multilayer film made of at least two types of layer, each having a different composition.

In the above phase shift mask blank manufacturing method, it is preferable for the alternately stacked multilayer film to be formed by changing the type of gas without stopping electric discharge. The metal silicide used in the inventive method is preferably molybdenum silicide.

By forming, in the manufacture of a phase shift mask blank, an alternately stacked multilayer film composed of at least two types of layer, each having different compositions and containing at least one element selected from among metals, silicon, oxygen and nitrogen, which are stacked in alternation, the invention improves chemical resistance to cleaning pre-treatment or to chemicals such as sulfuric acid used as cleaning fluids in phase shift mask production. The manufacturing process is thus stabilized, making it possible to produce high-quality phase shift masks which enable semiconductor integrated circuits to be fabricated to a smaller minimum feature size and a higher level of integration.

BRIEF DESCRIPTION OF THE DIAGRAMS

FIG. 6B is an enlarged view of region X in FIG. 6A.

DETAILED DESCRIPTION OF THE INVENTION

Figure 1:
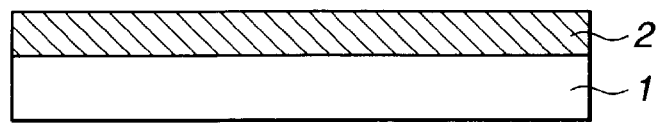
FIG. 1 is a sectional view of a phase shift mask blank which illustrates the prior art.
Figure 2:
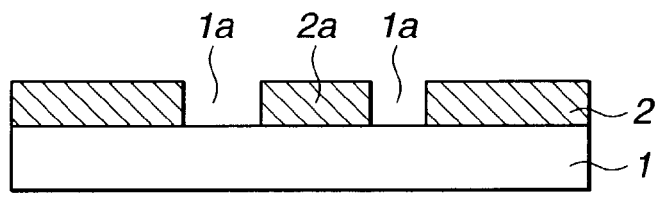
FIG. 2 is a sectional view of a phase shift mask made from the phase shift mask blank in FIG. 1.
Figure 3:
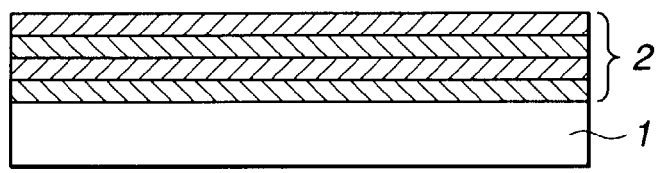
FIG. 3 is a sectional view of a phase shift mask blank according to one embodiment of the invention.

Referring to FIG. 3, the phase shift mask blanks of the invention are composed of a substrate 1 which is transparent to the exposure light, on top of which substrate 1 has been formed an alternately stacked multilayer film (phase shift film) 2 composed of at least two types of layer, each having a different composition and containing at least one element selected from among metals, silicon, oxygen and nitrogen, which are stacked in alternation. This construction ensures that the phase shift mask blanks are of a high quality and endowed with an excellent resistance to chemicals.

Exemplary phase shift films include alternately stacked films containing at least one element selected from among metals (e.g., molybdenum, titanium, tantalum, zirconium, hafnium, niobium, vanadium, cobalt, chromium, nickel), silicon, oxygen and nitrogen, such as alternately stacked films composed of molybdenum silicide oxide (MoSiO) and molybdenum silicide nitride (MoSiN), alternately stacked films composed of molybdenum silicide nitride (MoSiN) and molybdenum silicide oxide nitride (MoSiON), and alternately stacked films composed of molybdenum silicide oxide (MoSiO), molybdenum silicide oxide nitride (MoSiON) and molybdenum silicide nitride (MoSiN). Alternately stacked films composed of molybdenum silicide nitride (MoSiN) and molybdenum silicide oxide nitride (MoSiON) are preferred because they enable a thin phase shift film to be achieved. Having the outermost surface of the phase shift film made of molybdenum silicide nitride (MoSiN) is especially preferred because this confers the film with even better chemical resistance.

If the alternately stacked film has a single-layer film thickness that is too large, steps may form in the film due to differences between the etch rates for each layer. A single-layer thickness of not more than 50 nm, and especially not more than 30 nm, is preferred.

It is advantageous for the alternately stacked film to be formed by stacking a total of preferably 3 to 30 layers, and most preferably 5 to 20 layers. The alternately stacked film has an overall thickness of preferably 50 to 200 nm, and most preferably 50 to 150 nm.

Typically, the phase shift film changes the phase of exposure light passing through it by 180±5 degrees and has a transmittance of 3 to 40%. It is desirable for the transparent substrate used together with the phase shift film to be composed primarily of quartz or silicon dioxide.

The phase shift film manufacturing method of the invention preferably employs a reactive sputtering technique in which the sputtering target is composed primarily of a metal silicide. To keep the composition of the film constant, use may also be made of a metal silicide to which oxygen, nitrogen, or a combination thereof, has been added. Illustrative examples of the metal include molybdenum, titanium, tantalum, zirconium, hafnium, niobium, vanadium, cobalt, chromium and nickel. Of these, molybdenum is preferred.

The phase shift film may be formed by a continuous, in-line process which uses a number of film-forming chambers equal to the number of layers in the phase shift film being formed. However, such an approach increases the size of the production apparatus and raises costs. A method in which the alternately stacked multilayer film is formed in a batch-type or single-wafer processing system by changing the sputtering gas is thus preferred. One concern with the latter approach is the dust that is generated at the beginning of electric discharge, especially in cases where discharge is halted whenever the gas type and sputtering gas flow rate are changed. Because increased dust generation lowers film quality, it is preferable to change the type of gas and the sputtering gas flow rate ratio during electric discharge; that is, without halting discharge.

The sputtering method may be one which employs a direct-current power supply (DC sputtering) or a high-frequency power supply (RF sputtering). Either a magnetron sputtering system or a conventional sputtering system may be used.

The sputtering gas used to form the phase shift film is preferably an inert gas such as argon to which other gases such as oxygen, nitrogen and nitrogen oxide gases may be suitably added so as to give the phase shift film that is formed the desired composition and film stress.

The transmittance of the phase shift film being formed may be raised by increasing the amount of oxygen and nitrogen-containing gases added to the sputtering gas, or by using as the sputtering target a metal silicide to which a large amount of oxygen and nitrogen have been added, so as to incorporate more oxygen and nitrogen into the film.

Figure 4:
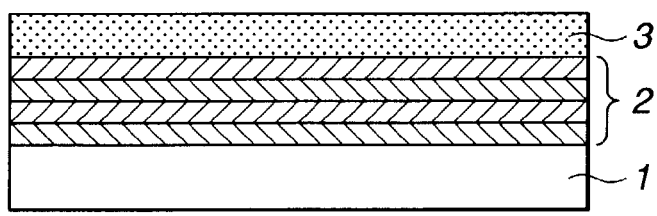
FIG. 4 is a sectional view of a phase shift mask blank according to another embodiment of the invention.
Figure 5:
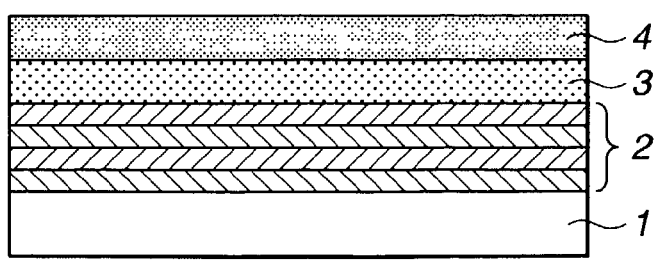
FIG. 5 is a sectional view of a phase shift mask blank according to yet another embodiment of the invention.
Figure 6A:
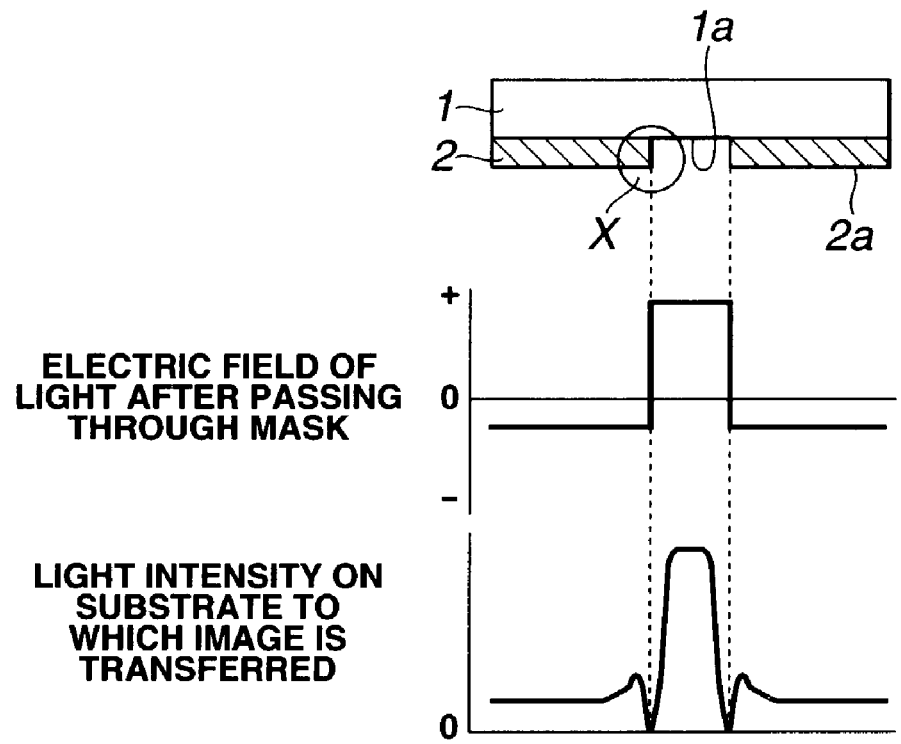
FIGS. 6A and 6B illustrate the operating principle of a halftone phase shift mask.
Figure 6B:
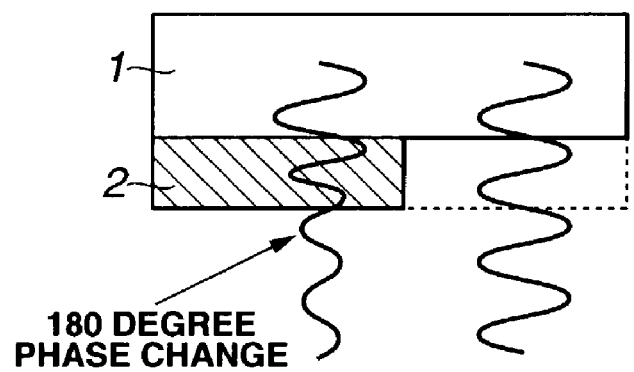

According to another embodiment of the invention, a chromium-based light-shielding film 3 may be provided on the phase shift film 2 in the manner shown in FIG. 4. According to yet another embodiment, as shown in FIG. 5, a chromium-based antireflection film 4 may be formed on the chromium-based light-shielding film 3 to reduce reflection from the latter. The light-shielding film and antireflection film 4 are preferably chromium-based films made of such compounds as CrO, CrN, CrON and CrCON.

EXAMPLES

The following examples and comparative examples are provided to illustrate the invention, and are not intended to limit the scope thereof.

Example 1

The following film-forming operations were carried out on a 6" square quartz substrate using a 3" $MoSi_{2.3}$ target and at a gas pressure during discharge of 0.3 Pa, a power of 200 W and a film-forming temperature of 120° C.:
1) formation of a MoSiN layer having a thickness of about 10 nm using a mixture of argon and nitrogen in a flow rate ratio of 1:7;
2) formation of a MoSiON layer having a thickness of about 10 nm using a mixture of argon, oxygen and nitrogen in a flow rate ratio of 1:1:6.

Film-forming operations 1) and 2) were repeatedly carried out in alternation without halting discharge. The process was concluded with the formation of a type 1) layer, yielding a 12-layer phase shift mask blank having a phase difference of 180 degrees.

The resulting phase shift mask blank was heated for one hour in an 80° C. mixture of sulfuric acid and hydrogen peroxide water (mixing ratio, 1:4). The transmittance of the phase shift mask blank before and after immersion was measured, and the change in transmittance was used to rate the chemical resistance.

The change in transmittance in this example was 0.05%. The results are given in Table 1.

Transmittance was measured at a wavelength of 248 nm using an MPM-24 phase shift measurement system manufactured by Lasertec Corporation.

Comparative Example 1

A MoSiON film was formed to a thickness of about 130 nm on a 6" square quartz substrate using a 3" $MoSi_{2.3}$ target, using a mixture of argon, nitrogen and oxygen in a flow rate ratio of 1:1:6 as the sputtering gas, and at a gas pressure during discharge of 0.3 Pa, a power of 200 W and a film-forming temperature of 120° C.

The chemical resistance was determined in the same manner as in Example 1. The change in transmittance was 0.12%. The results are given in Table 1.

TABLE 1

|  | Change in transmittance |
| --- | --- |
| Example 1 | 0.05% |
| Comparative Example 1 | 0.12% |

As demonstrated above, the present invention provides high-quality phase shift mask blanks having improved chemical resistance by alternately stacking two or more types of layer, each having different compositions and containing at least one element selected from among metals, silicon, oxygen and nitrogen, so as to form on a transparent substrate an alternately stacked multilayer phase shift film.

Japanese Patent Application No. 2001-192958 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A phase shift mask blank comprising a transparent substrate and a phase shift film on the substrate, wherein the substrate is transparent to exposure light and the phase shift film is a multilayer film made of at least two types of layers, which are manufactured by a reactive sputtering in which the sputtering target is composed primarily of a metal silicide, and each film has a different composition and contains at least one element selected from among metals, silicon, oxygen and nitrogen, which are stacked in alternation by stacking a total of 3 to 30 layers.

2. The phase shift mask blank of claim 1, wherein the phase shift film is an alternately stacked multilayer film made of molybdenum silicide nitride and molybdenum silicide oxide nitride.

3. The phase shift mask blank of claim 1, which changes the phase of exposure light passing through the multilayer film by 180±5 degrees and has a transmittance of 3 to 40%.

4. A method of manufacturing a phase shift mask blank composed of a transparent substrate and a phase shift film containing at least one element selected from among metals, silicon, oxygen and nitrogen on the substrate, the method being comprised of carrying out reactive sputtering using a metal silicide sputtering target while varying the type or flow rate of reactive gas in a single film-forming chamber so as to form as the phase shift film an alternately stacked multilayer film made of at least two types of layers, each having a different composition by stacking a total of 3 to 30 layers.

5. The phase shift mask blank manufacturing method of claim 4, wherein the alternately stacked multilayer film is formed by changing the type of gas without stopping electric discharge.

6. The phase shift mask blank manufacturing method of claim 4, wherein the metal silicide is molybdenum silicide.

7. The phase shift mask blank of claim 1, wherein the metal is at least one selected from the group consisting of molybdenum, titanium, tantalum, zirconium, hafnium, niobium, vanadium, cobalt, chromium and nickel.

8. The phase shift mask blank manufacturing method of claim 4, wherein the metal is at least one selected from the group consisting of molybdenum, titanium, tantalum, zirconium, hafnium, niobium, vanadium, cobalt, chromium and nickel.

9. The phase shift mask blank of claim 1, wherein an outermost surface of the phase shift film is made of molybdenum silicide nitride.

10. The phase shift mask blank manufacturing method of claim 4, wherein an outermost surface of the phase shift film is made of molybdenum silicide nitride.

11. The phase shift mask blank of claim 1, wherein each of said at least two types of layers of the multilayer film has a thickness of not more than 50 nm.

12. The phase shift mask blank manufacturing method of claim 4, wherein each of said at least two types of layers of the multilayer film has a thickness of not more than 50 nm.

13. The phase shift mask blank of claim 1, wherein the phase shift film has an overall thickness of 50 to 200 nm.

14. The phase shift mask blank manufacturing method of claim 4, wherein the phase shift film has an overall thickness of 50 to 200 nm.

15. The phase shift mask blank of claim 1, wherein a chromium-based light-shielding film is provided on the phase shift film.

16. The phase shift mask blank manufacturing method of claim 4, wherein a chromium-based light-shielding film is provided on the phase shift film.

17. The phase shift mask blank of claim 15, wherein a chromium-based antireflection film is formed on the chromium-based light-shielding film.

18. The phase shift mask blank manufacturing method of claim 16, wherein a chromium-based antireflection film is formed on the chromium-based light-shielding film.

* * * * *